(12) United States Patent
Kim (10) Patent No.: US 8,453,829 B1
(45) Date of Patent: Jun. 4, 2013

(54) HIGH PERFORMANCE WASHING INDUCING TRANSFER UNIT USING WIRE CONNECTED ROLLER

(76) Inventor: Yeong Hwan Kim, Incheon (KR)

( * ) Notice: Subject to any disclaimer, the term of this patent is extended or adjusted under 35 U.S.C. 154(b) by 0 days.

(21) Appl. No.: 13/314,511

(22) Filed: Dec. 8, 2011

(30) Foreign Application Priority Data

Nov. 15, 2011 (KR) .......................... 10-2011-0119002

(51) Int. Cl.
*B65G 13/06* (2006.01)
(52) U.S. Cl.
USPC ...................................... 198/791; 198/781.07
(58) Field of Classification Search
USPC ...................................... 198/781.07, 791, 833
See application file for complete search history.

(56) References Cited

U.S. PATENT DOCUMENTS

| | | | |
|---|---|---|---|
| 2,748,919 A * | 6/1956 | Britton et al. ................. | 198/791 |
| 3,729,088 A * | 4/1973 | Stein et al. ............... | 198/781.07 |
| 3,750,211 A * | 8/1973 | Zaun et al. ..................... | 198/791 |
| 4,205,746 A * | 6/1980 | Olson et al. ................... | 198/791 |
| 5,011,004 A * | 4/1991 | D'Amato ...................... | 198/791 |
| 5,287,956 A * | 2/1994 | Collins et al. ............ | 198/781.04 |
| 6,367,618 B1 * | 4/2002 | Szuba ........................... | 198/791 |
| 7,014,037 B2 * | 3/2006 | Groitl ....................... | 198/781.07 |
| 7,882,945 B2 * | 2/2011 | Willi et al. ..................... | 198/791 |

FOREIGN PATENT DOCUMENTS

KR   10-2011-0045934   5/2011

\* cited by examiner

*Primary Examiner* — James R Bidwell
(74) *Attorney, Agent, or Firm* — David S. Resnick; Nixon Peabody LLP (57) ABSTRACT

Disclosed is a high performance washing inducing transfer unit. The transfer unit includes support structures spaced apart from each other, bottom rotary transfer structures including a bottom shaft rotatably mounted odd number mounts of the support structures, bottom transfer rollers coupled to the bottom shaft and wires radially arranged and connected to the bottom transfer rollers, a top rotary transfer structure including a top shaft located above the bottom shaft and top transfer rollers coupled to the top shaft, a drive device to rotate the bottom and top shafts for transfer of an object, an intermediary rotary transfer structure including an intermediary shaft mounted to even number mounts, intermediary transfer rollers coupled to the intermediary shaft and wires radially arranged and connected to the intermediary transfer rollers, and a linkage device to transmit power of the drive device to the intermediary shaft of the intermediary rotary transfer structure.

6 Claims, 5 Drawing Sheets

HIGH PERFORMANCE WASHING INDUCING TRANSFER UNIT USING WIRE CONNECTED ROLLER

CROSS-REFERENCE TO RELATED APPLICATIONS

This application claims priority to Korean Patent Application No. 10-2011-0119002 filed on Nov. 15, 2011 the contents of which are incorporated herein by reference in its entirety.

BACKGROUND OF THE INVENTION

1. Field of the Invention

The present invention relates to technologies with regard to a high performance washing inducing transfer unit with wire connected rollers, which can provide an ejection space to allow an ejected fluid to reach upper and lower surfaces of an object to be transferred, particularly, for a thin or super thin printed circuit board during transfer thereof without interference, and also can prevent the board from being deformed by the pressure of the fluid ejected into the ejection space.

2. Description of the Related Art

As an example of technologies with regard to a transfer unit that is configured to prevent deformation of a thin or super thin printed circuit board during transfer of the board and to assure that a medicinal fluid or wash water is uniformly ejected over the entire board rather than being concentrated on a location of the board, Korean Patent Laid-Open Publication No. 10-2011-0045934 published on May 4, 2011 (hereinafter, referred to as 'prior art') discloses an invention entitled "Transfer unit using wire connected roller". The prior art was filed and published by the applicant of the present invention and registration thereof was granted on Oct. 28, 2011.

In the disclosed transfer unit of the prior art, in a state in which rotary transfer structures, which serve to transfer an object, i.e. a printed circuit board, are mounted to support structures so as to be vertically arranged in two rows, a gap between the neighboring rotary transfer structures may be too small to assure that a fluid ejected from upper and lower ejection nozzles is uniformly distributed over the entire surface of the object that is being transferred.

In addition, during rotation of the rotary transfer structures, the ejected fluid may be subjected to interference with wires of the rotary transfer structures to some extent.

To solve the above described problems, although increasing the gap between the neighboring rotary transfer structures has been proposed to provide a sufficient ejection space, it has been found that spacing the neighboring rotary transfer structures from each other may cause the object, i.e. the printed circuit board passing through the provided ejection space to bend in an ejection direction due to the pressure of the ejected fluid.

SUMMARY OF THE INVENTION

Therefore, the present invention has been made in view of the above problems, and it is an object of the present invention to provide a high performance washing inducing transfer unit, which can provide an ejection space to allow an ejected fluid to reach a surface of a board without interference with other components, and also can prevent the board passing through the provided space from being deformed due to the pressure of the ejected fluid to the maximum extent.

In accordance with the present invention, the above and other objects can be accomplished by the provision of a high performance washing inducing transfer unit using wire connected rollers, including two support structures, which are spaced apart from each other in a transverse direction thereof and respectively include a plurality of mounts in a longitudinal direction thereof, a plurality of bottom rotary transfer structures, each of which includes a bottom shaft, two bottom transfer rollers respectively coupled to both ends of the bottom shaft, and a bottom connection means including "x" wires (here, "x" is an integer number of 2 or larger), the wires being radially arranged around the outer circumference of the bottom shaft while being respectively connected at both ends thereof to the bottom transfer rollers, wherein the bottom shaft is rotatably mounted to both odd number mounts aligned on the same transverse line between the two support structures and wherein the two bottom transfer rollers are located inside the two support structures, a plurality of top rotary transfer structures, each of which includes a top shaft and two top transfer rollers respectively coupled to both ends of the top shaft, wherein the top shaft is rotatably mounted to both odd number mounts so as to be located above the bottom shaft and wherein the two top transfer rollers are located inside the two support structures so as to face the two bottom transfer rollers each other, a drive device configured to rotate the bottom and top shafts of the bottom and top rotary transfer structures, thereby enabling transfer of a target object between the bottom and top rotary transfer structures, a plurality of intermediary rotary transfer structures, each of which includes an intermediary shaft, two intermediary transfer rollers respectively coupled to both ends of the intermediary shaft, and an intermediary connection means including "z" wires (here, "z" is an integer number of 2 or larger), the wires being radially arranged around the outer circumference of the intermediary shaft while being respectively connected at both ends thereof to the intermediary transfer rollers, wherein the intermediary shaft is rotatably mounted to both even number mounts aligned on the same transverse line between the two support structures and wherein the two intermediary transfer rollers are located inside the two support structures, and linkage devices configured to transmit power of the drive device to the intermediary shafts of the respective intermediary rotary transfer structure in order to rotate the intermediary shafts, wherein the intermediary rotary transfer structures are divided into bottom intermediary rotary transfer structures arranged parallel to the bottom rotary transfer structures and top intermediary rotary transfer structures arranged parallel to the top rotary transfer structures, and wherein the linkage devices are divided into bottom linkage devices for the bottom intermediary rotary transfer structure and top linkage devices for the top intermediary rotary transfer structures.

The bottom intermediary rotary transfer structures and the top intermediary rotary transfer structures of all the intermediary rotary transfer structures may be vertically and alternately arranged.

The drive device may include a first intersecting gear and a bottom gear, which are coupled respectively to both ends of the bottom shaft of each bottom rotary transfer structure, a second intersecting gear engaged with the first intersecting gear with axes intersecting each other, a driven shaft, to which the second intersecting gear is axially coupled, the driven shaft having a driven pulley, a drive motor having a driving pulley, a belt to connect the driven pulley of the driven shaft and the driving pulley of the drive motor to each other, and a top gear coupled to an end of the top shaft of each top rotary transfer structure so as to be engaged with the bottom gear.

The bottom linkage device may include a linkage intersecting gear, which is coupled to an end of the intermediary shaft of each bottom intermediary rotary transfer structure while being engaged with the second intersecting gear with axes intersecting each other.

The top linkage device may include a first spur gear, which is coupled to the end of the bottom shaft of each bottom rotary transfer structure located close to the top intermediary rotary transfer structure, and a second spur gear, which is coupled to the end of the intermediary shaft of each top intermediary rotary transfer structure so as to be engaged with the first spur gear.

The top rotary transfer structure may further include a top connection means including "y" wires (here, "y" is an integer number of 2 or larger), the wires being radially arranged around the outer circumference of the top shaft while being respectively connected at both ends thereof to the top transfer rollers.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE INVENTION

Hereinafter, an exemplary embodiment of the present invention will be described in detail with reference to the accompanying drawings.

The terms or words used in the specification and claims of the present invention are not interpreted by strictly applying lexical meanings, and are construed as meanings and concepts conforming to the technical spirit of the present invention based on the principle that the inventors can appropriately define the concepts of the terms to explain the present invention in the best manner. Accordingly, it is to be understood that the detailed description, which will be disclosed along with the accompanying drawings, is intended to describe the most exemplary embodiment of the present invention and is not intended to represent all technical ideas of the present invention. Therefore, it should be understood that various equivalents and modifications can be made in lieu of the embodiments described in the time of the application.

Figure 1:
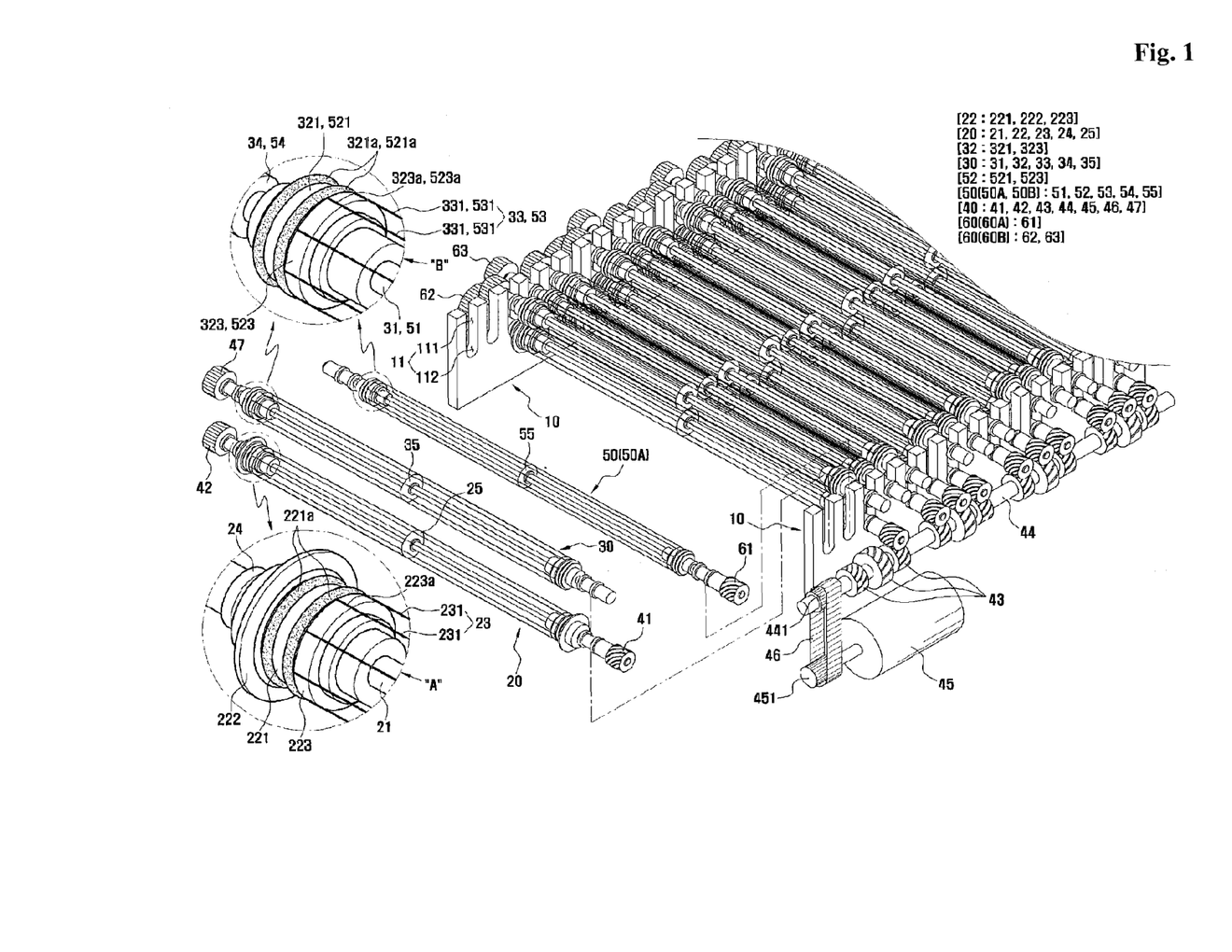
FIG. 1 is a perspective view illustrating a configuration of a transfer unit in accordance with the present invention.
Figure 3:
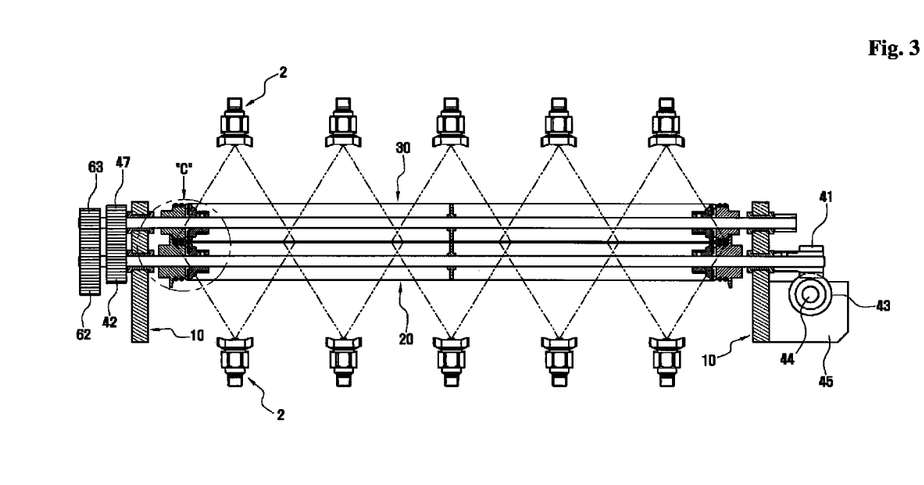
FIG. 3 is a front view of FIG. 1.
Figure 4:
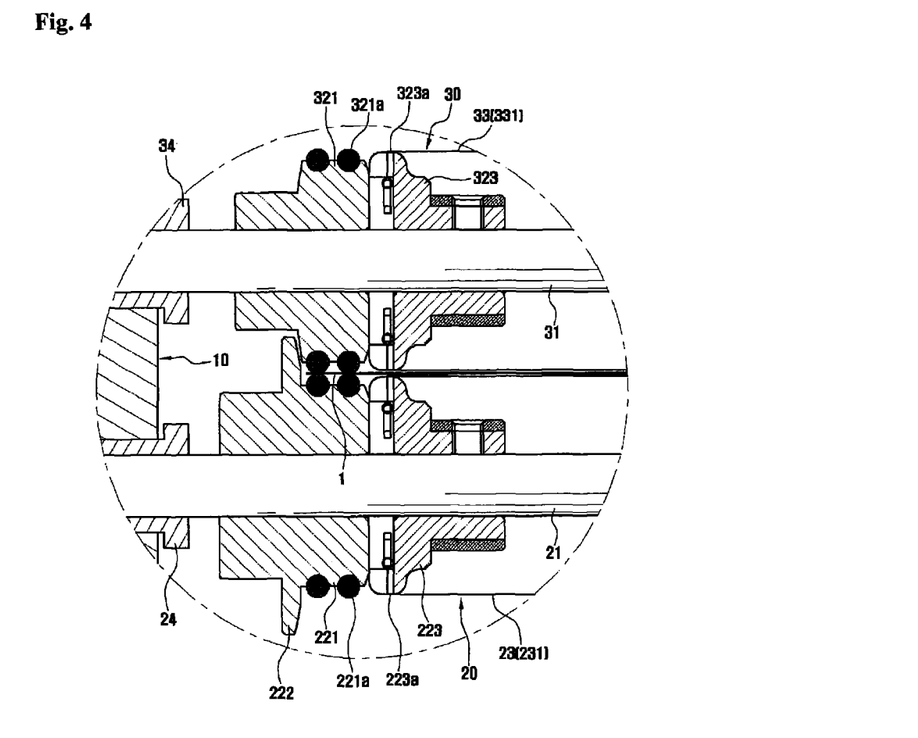
FIG. 4 is an enlarged view of the circle "C" of FIG. 3.

In FIG. 1, the circles "A" and "B" are respectively illustrated in enlarged views of corresponding regions. FIG. 4 is an enlarged view of the circle "C" of FIG. 3.

On the basis of FIG. 1, separated bottom and top rotary transfer structures are particularly defined by terms "front" or "front part", coupled bottom and top rotary transfer structures are particularly defined by terms "rear" or "rear part", top rotary transfer structures are particularly defined by terms "upper" and "above" and bottom rotary transfer structures are particularly defined by terms "lower" and "below".

Also, the term "an object to be transferred" that will be described below refers to an objective article that is located and transferred between each bottom rotary transfer structure and each top rotary transfer structure and particularly, refers to a thin or super thin Printed Circuit Board (PCB).

As illustrated in FIGS. 1 to 5, a high performance washing inducing transfer unit using wire connected rollers in accordance with the present invention includes a support structure 10, a bottom rotary transfer structure 20, a top rotary transfer structure 30, a drive device 40, an intermediary rotary transfer structure 50, and a linkage device 60.

Hereinafter, the aforementioned components will be described in more detail.

With regard to the support structure 1, as illustrated in FIG. 1, a pair of support structures 1 is spaced apart from each other in a transverse direction. The support structure includes a plurality of mounts 11, which are equidistantly arranged in a longitudinal direction.

Each of the mounts 11 includes an upper opening 111 and a lower base portion 112.

The opening 111 is configured in such a way that each rotary transfer structure 20, or 50 can be inserted into and separated from the opening 111, which ensures easy attachment/detachment of the rotary transfer structure 20, 30 or 50.

With regard to the bottom rotary transfer structure 20, as illustrated in FIGS. 1 to 4, a plurality of bottom rotary transfer structures 20 is rotatably mounted to the mounts 11 of the support structures 10 and serves to transfer an object to be transferred 1 (hereinafter, referred to as a transfer target object 1) disposed thereon.

The bottom rotary transfer structure 20 includes a bottom shaft 21, two bottom transfer rollers 22 respectively coupled to both ends of the bottom shaft 21, and a bottom connection means 23 including a number of wires 231, particularly, "x" wires 231 (here, "x" is an integer number of 2 or larger), the wires 231 being radially arranged around the outer circumference of the bottom shaft 21 while being respectively connected at both ends thereof to the two bottom transfer rollers 22.

In this case, the plurality of bottom rotary transfer structures 20 is mounted in such a way that each bottom shaft 21 is rotatably mounted to both odd number mounts 11 aligned on the same transverse line between the two support structures 10 and that the two bottom transfer rollers 22 are located inside the two support structures 10.

Referring to the circle "A" of FIG. 1, each of the two bottom transfer rollers 22 of the bottom rotary transfer structure 20 includes an inner bottom wheel 221, on which either end of the transfer target object 1 is disposed, an outer bottom wheel 222 adapted to support an outer wall of the transfer target object 1, and a bottom holding piece 223 mounted to the inner bottom wheel 221 to allow the wires 231 of the bottom connection means 23 to be radially secured to the bottom holding piece 223.

Preferably, the inner bottom wheel 221 is provided with an anti-slip member 221a, which comes into contact with the end of the transfer target object 1.

The anti-slip member 221a serves to guide stable transfer of the transfer target object 1 without a risk of slippage owing to friction with the end of the transfer target object 1. Preferably, the anti-slip member 221a is an annular O-ring or a flat O-ring having a rectangular cross section, which is formed of a material having a high coefficient of friction.

The respective outer bottom wheels 222 of the two bottom transfer rollers 22 are adapted to support both outer walls of the transfer target object 1. As such, stable transfer of the transfer target object 1 without left and right shaking is more likely.

The bottom connection means 23 includes the "x" wires 231 radially arranged and secured to the respective bottom holding pieces 223 of the two bottom transfer rollers 22.

Preferably, the bottom connection means 23 includes approximately 8 to 12 wires 231.

The bottom holding piece 223 is radially provided with slits 223a, to which the wires 231 are securely fixed.

The two bottom transfer rollers 22 of each bottom rotary transfer structure 20 may be removably coupled to the bottom shaft 21 by means of bolts, and the like. This enables replacement, repair, maintenance and the like of the anti-slip members 221a, the bottom transfer rollers 22 and the wires 231.

The transfer unit in accordance with the present invention, as illustrated in the circle "A" of FIG. 1, may further include a bottom support rotator 24 axially coupled to the bottom shaft 21 at a position to be supported by the base potion 112 of the corresponding mount 11 formed at the support structure 10.

The bottom support rotator 24 is of a flange type. The bottom support rotator 24 is inserted through the opening 111 of the corresponding mount 11 to thereby be closely engaged with the left and right peripheries of the base portion 112, thus serving to prevent outward separation of the bottom rotary transfer structure 20.

The transfer unit in accordance with the present invention further includes a bottom subtransfer roller 25. The bottom subtransfer roller 25, as illustrated in FIG. 1, is provided at a middle position of the bottom shaft 21 of each bottom rotary transfer structure 20 such that each wire 231 of the bottom connection means 23, one end of which is connected to the corresponding bottom transfer roller 22, is secured at the other end thereof to the bottom subtransfer roller 25.

The bottom subtransfer roller 25 serves to increase the support force of the wire 231 with respect to the transfer target object 1 and to prevent a middle portion of the wire 231 from sagging. In this way, through provision of the bottom subtransfer roller 25, it is possible to prevent deformation (i.e. bending, sagging and the like) of the transfer target object 1 that is disposed on the wires 231.

It will be appreciated that the presence of the bottom subtransfer roller 25 is not particularly useful where the transfer target object 1 has a small left-and-right width and sagging of the wires 231 connected to the two bottom transfer rollers 22 does not occur in a state in which the transfer target object 1 is disposed on the wires 231 of the bottom connection means 23.

On the contrary, where the transfer target object 1 has a great left-and-right width and sagging of the wires 231 occurs, the bottom subtransfer roller 25 may be selectively employed.

In conclusion, it will be appreciated that the bottom subtransfer rollers 25 may be selectively employed in consideration of various conditions, such as the left-and-right width and weight of the transfer target object 1, the tension, constituent material and diameter of the wires 231 and the like, and that the number and diameter of the employed bottom transfer subrollers 25 are variable.

Preferably, the wires 231 of the bottom connection means 23 as well as wires 331 and 531 of a top connection means and an intermediary connection means 53 which will be described hereinafter are formed of resins or stainless steel (SUS).

With regard to the top rotary transfer structure 30, as illustrated in FIGS. 1 to 4, a plurality of top rotary transfer structures 30 is rotatably mounted to the mounts 11 of the support structures 10 so as to be located above the bottom shafts 21 of the respective bottom rotary transfer structures 20. The top rotary transfer structures 30 serve to transfer the transfer target object 1 disposed on the bottom rotary transfer structures 20 in cooperation with the bottom rotary transfer structures 20.

The top rotary transfer structure 30 includes a top shaft 31, two top transfer rollers 32 respectively coupled to both ends of the top shaft 31, and a top connection means 33 including a number of wires 331, particularly, "y" wires 331 (here, "y" is an integer number of 2 or larger), the wires 331 being radially arranged around the outer circumference of the top shaft 31 while being respectively connected at both ends thereof to the top transfer rollers 32.

In this case, the plurality of top rotary transfer structures 30 is mounted in such a way that each top shaft 31 is rotatably mounted to both odd number mounts 11 so as to be located above the corresponding bottom shaft 21 and that the two top transfer rollers 32 are located inside the two support structures 10 so as to face the two bottom transfer rollers 22 each other.

Referring to the circle "B" of FIG. 1 and FIG. 4, each of the two top transfer rollers 32 of the top rotary transfer structure 30 includes an inner top wheel 321 adapted to come into contact with either end of the transfer target object 1, and a top holding piece 323 mounted to the inner top wheel 321 to allow the wires 331 of the top connection means 33 to be radially secured to the top holding piece 323.

Preferably, similar to the inner bottom wheel 221, the inner top wheel 321 is provided with an anti-slip member 321a, which comes into contact with the end of the transfer target object 1.

The top connection means 33 includes the "y" wires 331 radially arranged and secured to the respective top holding pieces 323 of the two top transfer rollers 32. Preferably, the top connection means 33 includes approximately 8 to 12 wires 331.

Similar to the bottom holding piece 223, the top holding piece 232 is radially provided with slits 323a, to which the wires 331 of the top connection means 33 are securely fixed.

The two top transfer rollers 32 of each top rotary transfer structure 20 may be removably coupled to the top shaft 31 by means of bolts, and the like, similar to the two bottom transfer rollers 22 of each bottom rotary transfer structure 20.

As illustrated in the circle "B" of FIG. 1, a top support rotator 34 may be further provided so as to be axially coupled to the top shaft 31, similar to the bottom support rotator 24 on the bottom shaft 21.

The top support rotator 34 is of a flange type. The top support rotator 34 is inserted through the opening 111 of the mount 11 to be closely engaged with the left and right peripheries of the base portion 112, thereby serving to prevent outward separation of the top rotary transfer structure 30.

Additionally, as illustrated in FIG. 1, a top subtransfer roller 35 may be further provided at a middle position of the top shaft 31 of each top rotary transfer structure 30 such that each wire 331 of the top connection means 33, one end of which is connected to the corresponding top transfer roller 32, is secured at the other end thereof to the top subtransfer roller 35, similar to the bottom subtransfer roller 25 of each bottom rotary transfer structure 20.

The top subtransfer roller 35 serves to prevent a middle portion of the wire 331 of the top connection means 33 from sagging.

The drive device 40, as illustrated in FIG. 1, serves to rotate the bottom and top shafts 21 and 31 of the bottom and top rotary transfer structures 20 and 30, thereby enabling transfer of the transfer target object 1 between the bottom and top rotary transfer structures 20 and 30.

The drive device 40 includes a first intersecting gear 41 and a bottom gear 42, which are coupled respectively to both ends of the bottom shaft 21 of each bottom rotary transfer structure 20, a second intersecting gear 43 engaged with the first intersecting gear 41 with axes intersecting each other, a driven shaft 44 to which the second intersecting gear 43 is axially coupled, the driven shaft 44 having a driven pulley 441, a drive motor 45 having a driving pulley 451, a belt 46 to connect the driven pulley 441 of the driven shaft 44 and the driving pulley 451 of the drive motor 45 to each other, and a top gear 47 coupled to an end of the top shaft 31 of each top rotary transfer structure 30 so as to be engaged with the bottom gear 42.

The first and second intersecting gears 41 and 43 are gears, axes of which intersect each other. As illustrated in FIG. 1, helical gears may be employed as the intersecting gears.

In some embodiments, the belt 46 may be replaced with a chain. In this case, the driven pulley 441 of the driven shaft 44 or the driving pulley 451 of the drive motor 45 may be replaced with pulleys of the type about which a chain can be wound.

During rotation of the bottom shaft 21 of each bottom rotary transfer structure 20, the bottom gear 42 and the top gear 47, which are engaged with each other, act to transmit rotational force of the bottom shaft 21 to the top shaft 31 of each top rotary transfer structure 30.

In this case, a key point with respect to the transmission of the rotational force is that a distance between the inner top wheel 321 of each top rotary transfer structure 30 and the inner bottom wheel 221 of each bottom rotary transfer structure 20 corresponds to a vertical thickness of the end of the transfer target object 1 in a state in which the bottom and top gears 42 and 47 are engaged with each other.

Accordingly, if each bottom rotary transfer structure 20 located below the transfer target object 1 is rotated by the drive device 40, each top rotary transfer structure 30 located above the transfer target object 1 is simultaneously rotated by the engaged bottom and top gears 42 and 47, which consequently allows the transfer target object 1 to be transferred between the bottom and top rotary transfer structures 20 and 30 vertically arranged in two rows.

Figure 5:
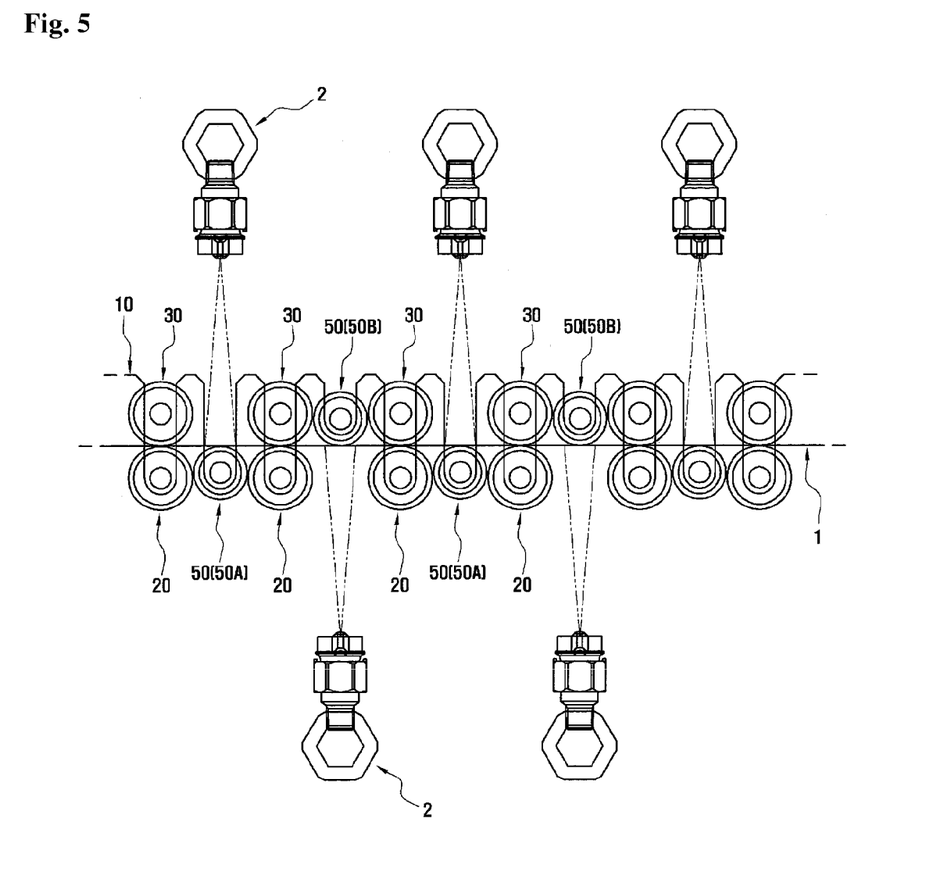
FIG. 5 is a partial side view of FIG. 1.

With regard to the intermediary rotary transfer structure 50, as illustrated in FIGS. 1 and 5, a plurality of intermediary rotary transfer structures 50 is rotatably mounted to the mounts 11 of the support structures 10.

The intermediary rotary transfer structure 50 includes an intermediary shaft 51, two intermediary transfer rollers 52 respectively coupled to both ends of the intermediary shaft 51, and an intermediary connection means 53 including a number of wires 531, particularly, "z" wires 531 (here, "z" is an integer number of 2 or larger), the wires 531 being radially arranged around the outer circumference of the intermediary shaft 51 while being respectively connected at both ends thereof to the intermediary transfer rollers 52.

In this case, the plurality of intermediary rotary transfer structures 50 is mounted in such a way that each intermediary shaft 51 is rotatably mounted to both even number mounting portions 11 aligned on the same transverse line between the two support structures and that the two intermediary transfer rollers 52 are located inside the two support structures 10.

Referring to the circle "B" of FIG. 1, each of the two intermediary transfer rollers 52 of the intermediary rotary transfer structure 50 includes an inner intermediary wheel 521 adapted to come into contact with an end of the transfer target object 1 and an intermediary holding piece 523 mounted to the inner intermediary wheel 521 to allow the wires 531 of the intermediary connection means 53 to be radially secured to the intermediary holding piece 523.

Preferably, the inner intermediary wheel 521 is provided with an anti-slip member 521a, which comes into contact with the end of the transfer target object 1, similar to the inner bottom wheel 221.

The intermediary connection means 53 includes the "z" wires 531 radially arranged and secured to the respective intermediary holding pieces 523 of the two intermediary transfer rollers 52. Preferably, the intermediary connection means 53 includes approximately 8 to 12 wires 531.

Similar to the bottom holding piece 223, the intermediary holding piece 523 is radially provided with slits 523a, to which the wires 531 of the intermediary connection means 53 are securely fixed.

The two intermediary transfer rollers 52 of each intermediary rotary transfer structure 50 may be removably coupled to the intermediary shaft 51 by means of bolts, and the like, similar to the two bottom transfer rollers 22 of each bottom rotary transfer structure 20.

As illustrated in the circle "B" of FIG. 1, an intermediary support rotator 54 may be further provided so as to be axially coupled to the intermediary shaft 51, similar to the bottom support rotator 24 on the bottom shaft 21.

The intermediary support rotator 54 is of a flange type. The intermediary support rotator 50 is inserted through the opening 111 of the mount 11 so as to be closely engaged with the left and right peripheries of the base portion 112, thereby serving to prevent outward separation of the intermediary rotary transfer structure 50.

In this case, the base portions 111 of the mounts 11 may have different heights according to whether they are associated with bottom intermediary support rotators or top intermediary support rotators. This will be described in more detail hereinafter.

Additionally, as illustrated in FIG. 1, an intermediary sub-transfer roller 55 may be further provided at a middle position of the intermediary shaft 51 of each intermediary rotary transfer structure 50 such that each wire 531 of the intermediary connection means 53, one end of which is connected to the corresponding intermediary transfer roller 52, is secured at the other end thereof to the intermediary subtransfer roller 55, similar to the bottom subtransfer roller 25 of the bottom rotary transfer structure 20.

The intermediary subtransfer roller 55 serves to prevent a middle portion of the wire 531 of the intermediary connection means 53 from sagging.

The intermediary rotary transfer structures 50 are divided into bottom intermediary rotary transfer structures arranged parallel to the bottom rotary transfer structures 20 and top intermediary rotary transfer structures arranged parallel to the top rotary transfer structures 30.

Hereinafter, the bottom intermediary rotary transfer structures are designated by reference numeral '50A' and the top intermediary rotary transfer structures are designated by reference numeral '50B'.

The intermediary shaft 51 of the bottom intermediary rotary transfer structure 50A is inserted through the opening 111 of the corresponding mount 11 formed at the support structure 10.

In this case, the base portion 112 of the mount 11, on which the intermediary shaft 51 of the bottom intermediary rotary transfer structure 50A is seated, has the same height as that of the base portion 112 on which the bottom shaft 21 of the bottom rotary transfer structure 20 is seated. In this way, the bottom intermediary rotary transfer structure 50A and the bottom rotary transfer structure 20 are arranged in parallel to each other.

The intermediary shaft 51 of the top intermediary rotary transfer structure 50B is inserted through the opening 111 of the corresponding mount 11 formed at the support structure 10.

In this case, the base portion 112 of the mount 11, on which the intermediary shaft 51 of the top intermediary rotary transfer structure 50B is seated, has a height that is determined to allow the top shaft 31 of the top rotary transfer structure 30 to be horizontally arranged in parallel to the intermediary shaft 51 of the top intermediary rotary transfer structure 50B.

The bottom intermediary rotary transfer structure 50A and the top intermediary rotary transfer structure 50B may have various arrangements when viewed from the lateral side.

In one example, only the bottom intermediary rotary transfer structures 50A may be arranged in a partial front section and only the top intermediary rotary transfer structures 50B may be arranged in a partial rear section, with respect to the longitudinal direction of the mounts 11 of each support structure 10.

However, in the present invention, as illustrated in FIG. 5, it is preferable that the bottom intermediary rotary transfer structures 50A and the top intermediary rotary transfer structures 50B of all the intermediary rotary transfer structures 50 be vertically and alternately arranged, in consideration of washing efficiency and uniform ejection of wash water (medicinal fluid, or the like) with respect to upper and lower surfaces of the transfer target object 1.

In this case, spray type ejection nozzles 2 are provided vertically above the respective bottom intermediary rotary transfer structures 50A for the purpose of etching, washing or the like. The ejection nozzles 2 serve to eject a medicinal fluid or wash water onto the upper surface of the target object 1 that is being transferred.

With the above described configuration, the bottom intermediary rotary transfer structures 50A may act to stably support the transfer target object 1 even if the transfer target object 1 is forced downward due to the pressure of the ejected fluid, thereby preventing downward bending of the transfer target object 1.

In addition, the spray type ejection nozzles 2 are further provided vertically below the respective top intermediary rotary transfer structures 50B for the purpose of etching, washing or the like, such that the medicinal fluid or wash water is ejected to the lower surface of the target object 1 that is being transferred.

In this way, the top intermediary rotary transfer structures 50B may act to stably support the transfer target object 1 even if the transfer target object 1 is forced upward due to the pressure of the ejected fluid, thereby preventing upward bending of the transfer target object 1.

The transfer target object 1, which is transferred by the transfer unit in accordance with the present invention, includes edge regions (i.e. end regions) in which no circuitry is provided, the edge regions being adapted to come into contact with the respective transfer rollers 22, 32 and 52, and a central region adapted to be supported by the wires 231, 331 and 531 of the respective connection means 23, 33 and 53. This configuration may effectively minimize the defect proportion and error rate of printed circuit boards as the transfer target object 1 during transfer thereof.

The linkage device 60 serves to transmit power of the drive device 40 to the intermediary shaft 51 so as to rotate the intermediary shaft 51 of each intermediary rotary transfer structure 50.

In the present invention, a plurality of linkage devices is provided and is divided into bottom linkage devices for the bottom intermediary rotary transfer structure 50A and top linkage devices for the top intermediary rotary transfer structures 50B.

Hereinafter, the bottom linkage devices are designated by reference numeral '60A' and the top linkage devices are designated by reference numeral '60B'.

The bottom linkage device 60A, as illustrated in FIG. 1, includes a linkage intersecting gear 61, which is coupled to an end of the intermediary shaft 51 of each bottom intermediary rotary transfer structure 50A while being engaged with the second intersecting gear 43 with axes intersecting each other.

Preferably, the number of the second intersecting gears 43 arranged on the driven shaft 44 is equal to the number of the bottom intermediary rotary transfer structures 50A.

To sum up, if the drive motor 45 rotates the second intersecting gears 43, the linkage intersecting gears 61 engaged with the second intersecting gears 43 are rotated, causing the intermediary shafts 51 of the bottom intermediary rotary transfer structures 50A to be rotated.

Figure 2:
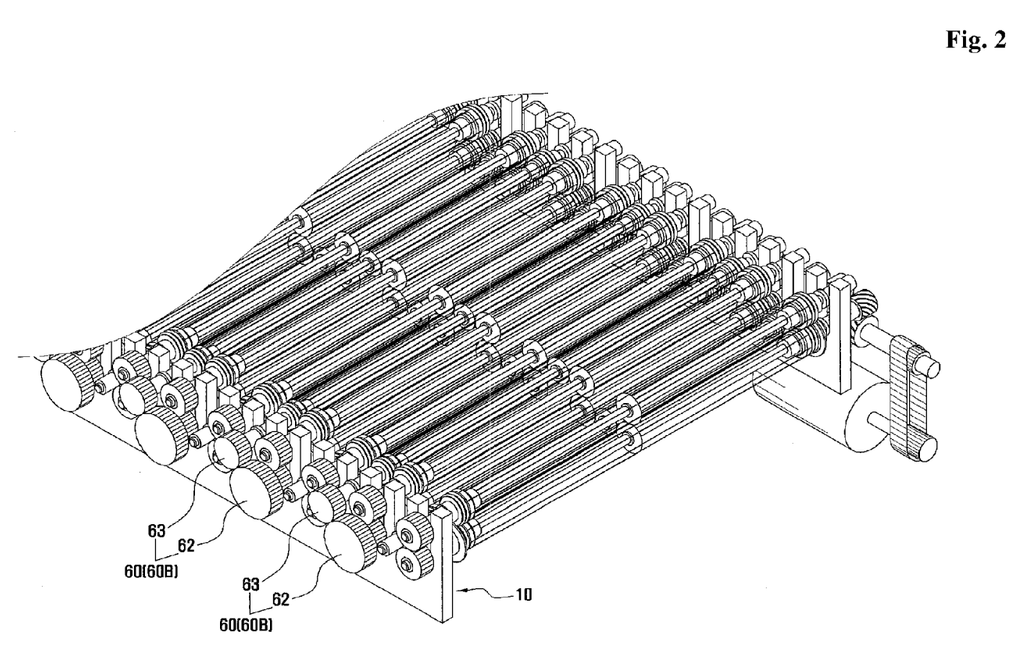
FIG. 2 is a perspective view when viewed from a different direction from FIG. 1.

As illustrated in FIGS. 1 and 2, the top linkage device 60B includes a first spur gear 62, which is coupled the end of the bottom shaft 21 of each bottom rotary transfer structure 20 located close to the top intermediary rotary transfer structure 50B, and a second spur gear 63, which is coupled to the end of the intermediary shaft 51 of each top intermediary rotary transfer structure 50B so as to be engaged with the first spur gear 62.

When viewed from the lateral side, the top intermediary rotary transfer structure 50B is located diagonally close to the bottom rotary transfer structure 20, thereby being rotated upon receiving power from the bottom rotary transfer structure 20.

In other words, if the bottom shaft 21 of the bottom rotary transfer structure 20 is rotated, the first spur gear 62 is rotated and in turn, the intermediary shaft 51 of the top intermediary rotary transfer structure 50B is finally rotated by the second spur gear 63 engaged with the first spur gear 62.

In the above description of the present invention, although the "high performance washing inducing transfer unit using wire connected rollers" having the particular shape and configuration has mainly been described with reference to the accompanying drawings, various modifications and variations of the present invention may be made by those skilled in the art and these modifications and variations should be construed as coming within the scope of the present invention.

As is apparent from the above description, a high performance washing inducing transfer unit using wire connected rollers in accordance with the present invention has the following several effects: stable transfer of an object can be accomplished by rotary transfer structures vertically arranged in two rows; ejection spaces can be provided between respective neighboring rotary transfer structures; additional intermediary rotary transfer structures can be provided respectively in the provided spaces so as to be vertically and alternately arranged; ejection nozzles are located vertically above the bottom intermediary rotary transfer structures and also, are located vertically below the top intermediary rotary transfer structures, which can prevent the object, particularly, a printed circuit board passing through the provided spaces from being deformed due to the pressure of an ejected fluid; and the spaces between the neighboring rotary transfer structures can allow the ejected fluid to reach a surface of the board without interference with other components, which can result in stable transfer of the board and optimal ejection of the fluid.

Although the exemplary embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A high performance washing inducing transfer unit using wire connected rollers, the transfer unit comprising:

two support structures, which are spaced apart from each other in a transverse direction thereof and respectively include a plurality of mounts in a longitudinal direction thereof;

a plurality of bottom rotary transfer structures, each of which includes a bottom shaft, two bottom transfer rollers respectively coupled to both ends of the bottom shaft, and a bottom connection means including "x" wires (here, "x" is an integer number of 2 or larger), the wires being radially arranged around the outer circumference of the bottom shaft while being respectively connected at both ends thereof to the bottom transfer rollers, wherein the bottom shaft is rotatably mounted to both odd number mounts aligned on the same transverse line between the two support structures and wherein the two bottom transfer rollers are located inside the two support structures;

a plurality of top rotary transfer structures, each of which includes a top shaft and two top transfer rollers respectively coupled to both ends of the top shaft, wherein the top shaft is rotatably mounted to both odd number mounts so as to be located above the bottom shaft and wherein the two top transfer rollers are located inside the two support structures so as to face the two bottom transfer rollers each other;

a drive device configured to rotate the bottom and top shafts of the bottom and top rotary transfer structures, thereby enabling transfer of a target object between the bottom and top rotary transfer structures;

a plurality of intermediary rotary transfer structures, each of which includes an intermediary shaft, two intermediary transfer rollers respectively coupled to both ends of the intermediary shaft, and an intermediary connection means including "z" wires (here, "z" is an integer number of 2 or larger), the wires being radially arranged around the outer circumference of the intermediary shaft while being respectively connected at both ends thereof to the intermediary transfer rollers, wherein the intermediary shaft is rotatably mounted to both even number mounts aligned on the same transverse line between the two support structures and wherein the two intermediary transfer rollers are located inside the two support structures; and linkage devices configured to transmit power of the drive device to the intermediary shafts of the respective intermediary rotary transfer structure in order to rotate the intermediary shafts, wherein the intermediary rotary transfer structures are divided into bottom intermediary rotary transfer structures arranged parallel to the bottom rotary transfer structures and top intermediary rotary transfer structures arranged parallel to the top rotary transfer structures, and wherein the linkage devices are divided into bottom linkage devices for the bottom intermediary rotary transfer structures and top linkage devices for the top intermediary rotary transfer structures.

2. The transfer unit according to claim 1, wherein the bottom intermediary rotary transfer structures and the top intermediary rotary transfer structures of all the intermediary rotary transfer structures are vertically and alternately arranged.

3. The transfer unit according to claim 2, wherein the drive device includes:

a first intersecting gear and a bottom gear, which are coupled respectively to both ends of the bottom shaft of each bottom rotary transfer structure;

a second intersecting gear engaged with the first intersecting gear with axes intersecting each other;

a driven shaft, to which the second intersecting gear is axially coupled, the driven shaft having a driven pulley;

a drive motor having a driving pulley;

a belt to connect the driven pulley of the driven shaft and the driving pulley of the drive motor to each other; and a top gear coupled to an end of the top shaft of each top rotary transfer structure so as to be engaged with the bottom gear.

4. The transfer unit according to claim 3, wherein the bottom linkage device includes a linkage intersecting gear, which is coupled to an end of the intermediary shaft of each bottom intermediary rotary transfer structure while being engaged with the second intersecting gear with axes intersecting each other.

5. The transfer unit according to claim 3, wherein the top linkage device includes:

a first spur gear, which is coupled to the end of the bottom shaft of each bottom rotary transfer structure located close to the top intermediary rotary transfer structure; and a second spur gear, which is coupled to the end of the intermediary shaft of each top intermediary rotary transfer structure so as to be engaged with the first spur gear.

6. The transfer unit according to claim 1, wherein the top rotary transfer structure further includes a top connection means including "y" wires (here, "y" is an integer number of 2 or larger), the wires being radially arranged around the outer circumference of the top shaft while being respectively connected at both ends thereof to the top transfer rollers.

* * * * *